United States Patent
Yuasa et al.

(10) Patent No.: US 10,381,241 B2
(45) Date of Patent: Aug. 13, 2019

(54) METHOD OF MANUFACTURING SEMICONDUCTOR DEVICE, SUBSTRATE PROCESSING APPARATUS, AND RECORDING MEDIUM

(71) Applicant: HITACHI KOKUSAI ELECTRIC INC., Tokyo (JP)

(72) Inventors: Kazuhiro Yuasa, Toyama (JP); Noriaki Michita, Toyama (JP)

(73) Assignee: KOKUSAI ELECTRIC CORPORATION, Tokyo (JP)

(*) Notice: Subject to any disclaimer, the term of this patent is extended or adjusted under 35 U.S.C. 154(b) by 0 days.

(21) Appl. No.: 15/921,249

(22) Filed: Mar. 14, 2018

(65) Prior Publication Data
US 2018/0204735 A1 Jul. 19, 2018

Related U.S. Application Data

(63) Continuation of application No. PCT/JP2015/077776, filed on Sep. 30, 2015.

(51) Int. Cl.
*H01L 21/322* (2006.01)
*H01L 21/02* (2006.01)
(Continued)

(52) U.S. Cl.
CPC ........ *H01L 21/322* (2013.01); *H01L 21/0245* (2013.01); *H01L 21/02381* (2013.01);
(Continued)

(58) Field of Classification Search
CPC ............. H01L 21/322; H01L 21/67115; H01L 21/02675; H01L 21/2686; H01L 21/324; H01L 21/265; H01L 21/20; H01L 21/268; H01L 21/31

USPC ......................................................... 438/473
See application file for complete search history.

(56) References Cited

U.S. PATENT DOCUMENTS

2002/0164864 A1   11/2002  Sotani
2007/0167029 A1*   7/2007  Kowalski .......... H01L 21/02238
                                                          438/769
(Continued)

FOREIGN PATENT DOCUMENTS

JP    2002-289521 A    10/2002
JP    2012-104703 A     5/2012
(Continued)

OTHER PUBLICATIONS

International Search Report dated Dec. 28, 2015 of PCT International Application No. PCT/JP2015/077776.

*Primary Examiner* — Vu A Vu
(74) *Attorney, Agent, or Firm* — Volpe and Koenig, P.C.

(57) ABSTRACT

There is provide a technique that includes preparing a substrate, in which an insulating film is formed on a pattern having an aspect ratio of 20 or greater and a process target film having a thickness of 200 Å or smaller is formed on the insulating film, in a process chamber; raising a temperature of the substrate to a first temperature with an electromagnetic wave; crystallizing the process target film for a first process time period while maintaining the first temperature; raising the temperature of the substrate to a second temperature, which is higher than the first temperature, with the electromagnetic wave, after the act of crystallizing the process target film; and repairing a crystal defect of the crystallized process target film for a second process time period, which is shorter than the first process time period, while maintaining the second temperature.

16 Claims, 12 Drawing Sheets

(51) Int. Cl.
*H01L 21/268* (2006.01)
*H01L 21/324* (2006.01)
*H01L 21/67* (2006.01)
*H01L 21/677* (2006.01)

(52) U.S. Cl.
CPC .. *H01L 21/02488* (2013.01); *H01L 21/02494* (2013.01); *H01L 21/02532* (2013.01); *H01L 21/02667* (2013.01); *H01L 21/02675* (2013.01); *H01L 21/2686* (2013.01); *H01L 21/324* (2013.01); *H01L 21/67115* (2013.01); *H01L 21/67248* (2013.01); *H01L 21/67757* (2013.01)

(56) References Cited

U.S. PATENT DOCUMENTS

| | | | |
|---|---|---|---|
| 2011/0014781 A1* | 1/2011 | Itokawa | H01L 21/02381 438/486 |
| 2012/0086107 A1 | 4/2012 | Yamamoto et al. | |
| 2012/0273790 A1 | 11/2012 | Aoyama et al. | |
| 2014/0065805 A1 | 3/2014 | Suguro | |
| 2014/0283734 A1* | 9/2014 | Monden | C30B 1/023 117/8 |

FOREIGN PATENT DOCUMENTS

| | | |
|---|---|---|
| JP | 2012-234864 A | 11/2012 |
| JP | 2014-053380 A | 3/2014 |
| JP | 2014-187274 A | 10/2014 |

* cited by examiner

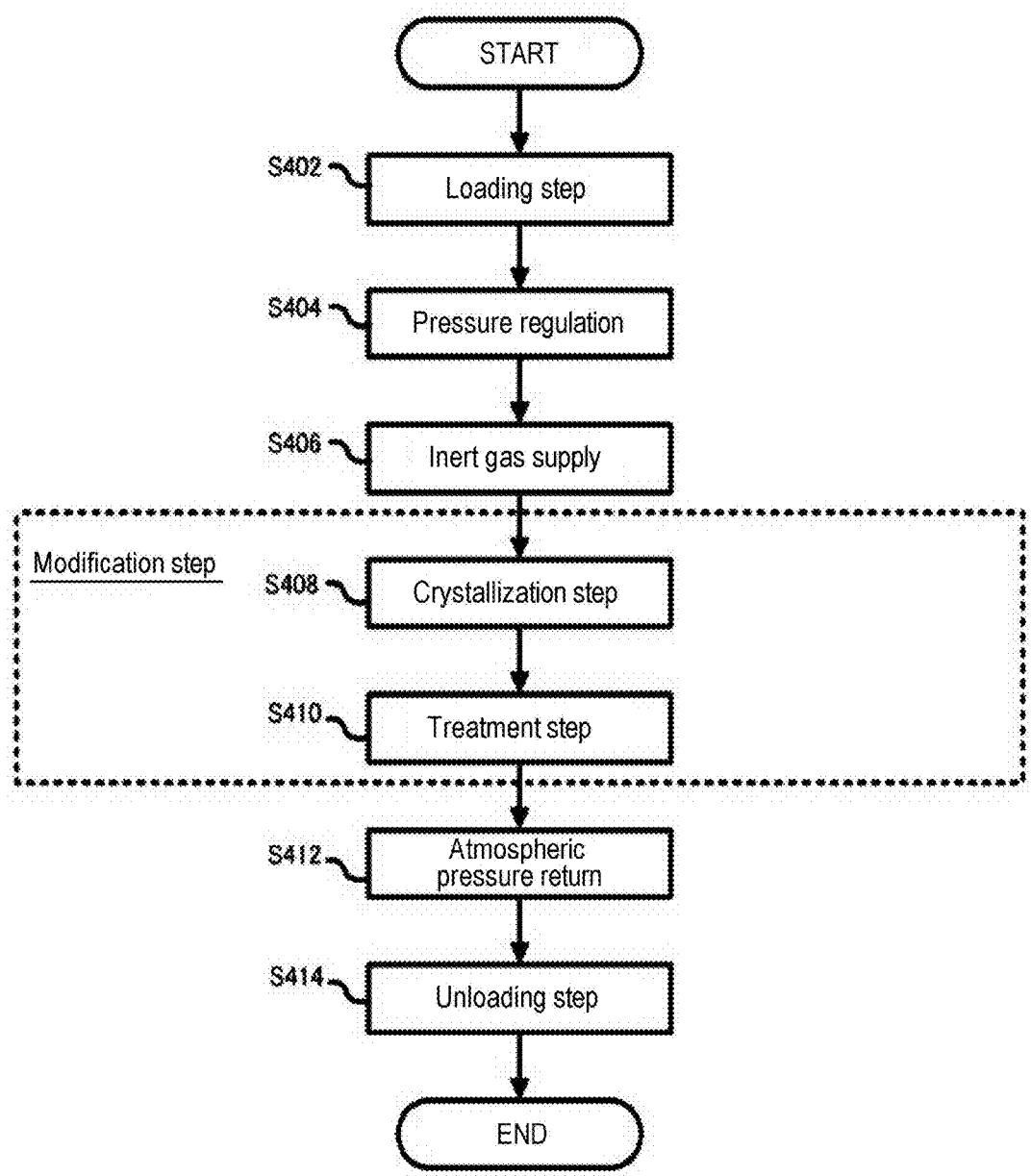

METHOD OF MANUFACTURING SEMICONDUCTOR DEVICE, SUBSTRATE PROCESSING APPARATUS, AND RECORDING MEDIUM

CROSS-REFERENCE TO RELATED APPLICATION

This application is a Bypass Continuation Application of PCT International Application No. PCT/JP2015/077776, filed on Sep. 30, 2015, the entire contents of which are incorporated herein by reference.

TECHNICAL FIELD

The present disclosure relates to a method of manufacturing a semiconductor device, a substrate processing apparatus, and a recording medium.

BACKGROUND

As one of the processes of manufacturing a semiconductor device, there is an annealing process for heating a substrate in a process chamber using, for example, a heating device, to change the composition or crystal structure of a thin film formed on a surface of the substrate. In recent semiconductor devices, device structures such as 3DNAND have been designed in three dimensions. Thus, it is necessary to modify a film formed in a pattern shape with a high aspect ratio (hereinafter, referred to as an A/R).

However, it is difficult to uniformly modify a film formed in a pattern shape with a high aspect ratio, and in modification by lamp heating (flash lamp anneal: FLA) or modification by heating of a coil heater or the like (thermal anneal), it was difficult to process a film formed in corners of a pattern such as a deep groove only by modifying only the surface of the film.

SUMMARY

According to an aspect of the present disclosure, there is provide a technique that includes: preparing a substrate, in which an insulating film as a base film is formed on a pattern having an aspect ratio of 20 or greater and a process target film having a thickness of 200 Å or smaller is formed on the insulating film, in a process chamber; raising a temperature of the substrate to a first temperature with an electromagnetic wave supplied from a heating device; processing the substrate for a first process time period while maintaining the first temperature; raising the temperature of the substrate from the first temperature to a second temperature, which is higher than the first temperature, with the electromagnetic wave supplied from the heating device, after the act of processing the substrate; and processing the substrate for a second process time period, which shorter than the first process time period, while maintaining the second temperature.

BRIEF DESCRIPTION OF DRAWINGS

FIG. 4 is a diagram illustrating a flow of substrate processing in the present disclosure.

DETAILED DESCRIPTION

Figure 1:
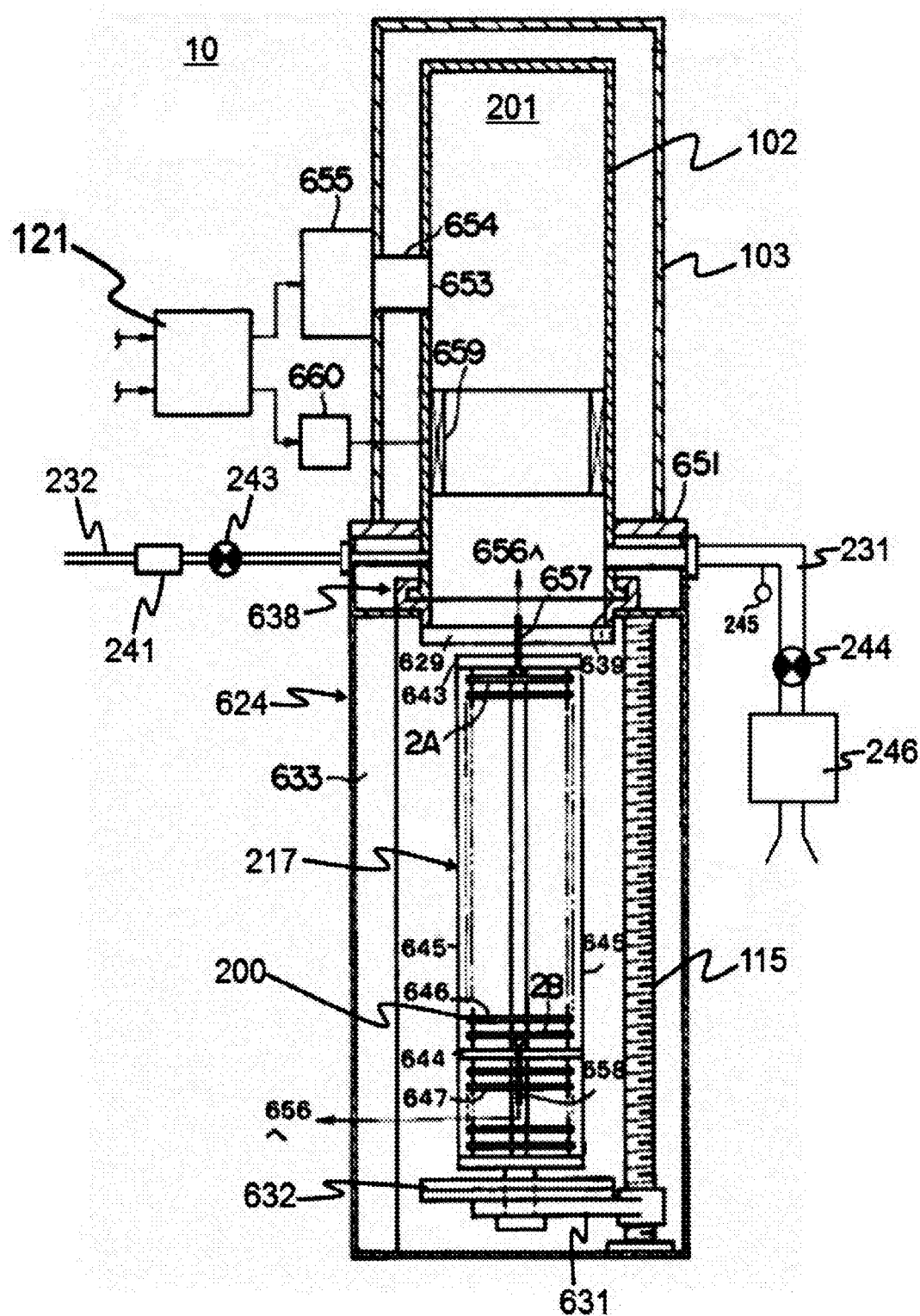
FIG. 1 is a schematic configuration diagram of a vertical type processing furnace of a substrate processing apparatus suitably used in a first embodiment of the present disclosure, in which a portion of the processing furnace is shown in a vertical cross sectional view.

Embodiments of the present disclosure will be now described in detail with reference to the drawings. Like or equivalent components, members, and processes illustrated in each drawing are given like reference numerals and a repeated description thereof will be properly omitted. Further, the embodiments are presented by way of example only, and are not intended to limit the present disclosure, and any feature or combination thereof described in the embodiments may not necessarily be essential to the present disclosure.

First Embodiment of the Present Disclosure

A first embodiment of the present disclosure will be described as below with reference to the drawings.

(1) Configuration of the Substrate Processing Apparatus

In the present embodiment, a substrate processing apparatus according to the present disclosure is configured as a batch-type vertical type heat treatment apparatus that performs various heat treatments on a wafer.

(Process Chamber)

As illustrated in FIG. 1, a substrate processing apparatus 10 has a processing furnace, in which the processing furnace has a reaction tube 102 as an electromagnetic wave shield. The reaction tube 102 is made of a conductive material that can effectively suppress leakage of a electromagnetic wave. For example, copper, aluminum, stainless steel, platinum, silver or the like may be used as this conductive material. However, the reaction tube 102 is not limited to being made of only a conductive material.

In addition, the reaction tube 102 may be formed by a double tube structure having an inner reaction tube (inner tube) made of a material that can transmit an electromagnetic wave, and an outer reaction tube (outer tube) which is arranged on the outer periphery of the inner tube and made of a material which cannot transmit an electromagnetic wave, such as reflecting or absorbing the electromagnetic wave, or may be formed solely by a structure such as a multilayer shielding material or the like. For example, when the reaction tube has a double tube structure, the inner tube may be made of quartz and the outer tube may be made of a metal tube such as stainless steel. Similarly, the multilayer shielding material may be constructed by forming a reflective surface for reflecting an electromagnetic wave and an absorption layer for absorbing an electromagnetic wave on an inner surface of a base material made of a conductive material.

Furthermore, the inner tube used in the aforementioned double tube structure may be formed by using the shape of either a case where it has a cylindrical shape with its upper end and lower end opened and forms a process chamber 201, which will be described later, as a process space for processing a substrate together with the outer tube, or a case where it has a cylindrical shape with its upper end closed and its lower end opened and forms the process chamber 201 by the inner tube solely.

In FIG. 1, the reaction tube 102 has a cylindrical shape with its upper end closed and its lower end opened, and is vertically disposed and fixedly supported so that the center line of the cylinder is perpendicular to the inner side of a case 103 as described hereinbelow. The process chamber 201 configured to accommodate a plurality of wafers 200 is formed in a hollow cylindrical portion of the reaction tube 102, and it is configured such that the inner diameter of the reaction tube 102 is larger than a maximum outer diameter of a boat 217 as described hereinbelow and is larger than a maximum outer diameter of wafers 200 to be treated.

A furnace opening flange 638 is installed in a lower end portion of the reaction tube 102. The furnace opening flange 638 forms a furnace opening 639 of the process chamber 201. The reaction tube 102 is vertically installed with the furnace opening flange 638 supported by a sub housing 624.

As illustrated in FIG. 1, a boat elevator 115 is installed directly below and near the process chamber 201. A seal cap 632 supported by an arm 631 of the boat elevator 115 closes the furnace opening 639. That is, the seal cap 632 is formed in a disc shape having a diameter larger than the diameter of the furnace opening 639 and substantially equal to the outer diameter of the furnace opening flange 638, and is moved up by the boat elevator 115 so as to hermetically seal the furnace opening 639.

(Exhaust Part)

An exhaust port, which is one end of an exhaust pipe 231 configured to exhaust the internal atmosphere of the process chamber 201, is installed on a sidewall of the lower end portion of the reaction tube 102. A vacuum pump (exhaust pump) 246 as a vacuum exhaust device is connected to the exhaust pipe 231 via a pressure sensor 245 as a pressure detector (pressure detection part) which detects the internal pressure of the process chamber and an auto pressure controller (APC) valve 244 as a pressure regulator (pressure regulation part). The APC valve 244 is a valve configured so that the vacuum exhaust of the interior of the process chamber 201 and the vacuum exhaust stop can be performed by opening and closing the APC valve 244 while operating the vacuum pump 246 and so that the internal pressure of the process chamber 201 can be adjusted by adjusting the opening degree of the APC valve 244 based on the pressure information detected by the pressure sensor 245 while operating the vacuum pump 246. An exhaust system mainly includes the exhaust pipe 231, the APC valve 244, and the pressure sensor 245. The vacuum pump 246 may be regarded as being included in the exhaust system.

(Gas Supply Part)

A gas supply port, which is one end of an inert gas supply pipe 232 for supplying an inert gas to the process chamber 201, is connected to a position different from the exhaust pipe 231 of the reaction tube 102.

Furthermore, the process chamber 201 of the present embodiment is not limited to the aforementioned form. For example, a manifold made of metal that supports the reaction tube 102 may be installed below the reaction tube 102, and the gas supply pipe 232 may be installed so as to penetrate a sidewall of the manifold. In this case, the exhaust pipe 231 described above may be additionally installed in the manifold. Even in this case, the exhaust pipe 231 may be installed on the sidewall below the reaction tube, instead of the manifold.

A mass flow controller (MFC) 241, which is a flow rate controller (flow rate control part), and a valve 243, which is an opening/closing valve, are installed in the gas supply pipe 232 sequentially from the upstream side of the gas supply pipe 232, respectively.

As described above, in the present embodiment, a gas is transferred through the gas supply port, which is disposed in a vertically-elongated space with an annular shape, i.e., a cylindrical space, defined by the inner surface of the sidewall of the reaction tube 102 and the end portions (peripheral edge portions) of the plurality of wafers 200 supported in multiple stages along a vertical direction. The gas is injected into the reaction tube 102. Accordingly, the gas mainly flows in the reaction tube 102 in a direction parallel to surfaces of the wafers 200, i.e., in a horizontal direction. With this configuration, a film-forming gas (a precursor gas or a reaction gas for forming a film), a cooling gas, or an inert gas, such as a purge gas to be supplied as necessary, can be uniformly supplied onto the respective wafers 200 so that the environment of the respective wafers 200 can be equalized. In addition, the gas flowing on the surfaces of the wafers 200, i.e., the residual gas, flows toward the exhaust port, i.e., the exhaust pipe 231 which will be described later. The flow direction of the residual gas is not limited to the vertical direction but may be appropriately specified depending on a position of the exhaust port.

An inert gas supply system mainly includes the gas supply pipe 232, the MFC 241, and the valve 243. The inert gas supply system may also be referred to as a purge gas supply system or a cooling gas supply system.

As the inert gas, it may be possible to use, in addition to an $N_2$ gas, a rare gas such as an Ar gas, an He gas, an Ne gas, a Xe gas or the like.

(Substrate Support)

As illustrated in FIG. 1, the boat 217 serving as a substrate support (substrate support part) configured to support the wafers 200 is vertically standing and supported on the seal cap 632. That is, the boat 217, which is configured to support the plurality of wafers 200 at predetermined intervals in multiple stages along the vertical direction, loads the wafers into the process chamber 201 (boat loading) or unloads the wafers from the process chamber 201 (boat unloading). The boat 217 is made of a heat resistant material such as quartz or silicon carbide (SiC). The boat 217 has a pair of end plates 643 and 644 at the top and bottom, and three support posts 645. The three support posts 645 are vertically crosslinked between both end plates 643 and 644. A plurality of support grooves 646 are arranged and respectively formed in the three support posts 645 at equal intervals in the vertical direction, and the support grooves 646 in the same stage form the same plane. That is, the boat 217 is configured to support the outer peripheral edge portion of the wafers 200 by the support grooves 646 of the same stage, in such a state that the wafers 200 are arranged along the vertical direction with the centers of the wafers 200 aligned with one another. Here, a substrate mounting part on which the substrate is placed mainly includes the support posts 645 and the support grooves 646.

The boat 217 is configured to support at least one wafer 200, for example, about 25 to 250 wafers 200 at a time. Monitor wafers 2A and 2B, which will be described later, are arranged in the vertical direction of the wafers 200, and a plurality of heat insulating plates 647 are arranged below the boat 217. The heat insulating plates 647 are arranged to suppress radiation of heat from the lower side of the process chamber 201, but instead of arranging not only the heat insulating plates 647 but also the monitor wafers, a dummy substrate (dummy wafer) or a silicon plate (Si plate) made of a material which has thermal characteristics similar to those of the wafers 200 and which is different from that of the wafers 200 for heat insulating may be arranged above or below the wafers 200, or both.

With this configuration, the heat generated in the wafers 200 can be suppressed from being dissipated. Thus, it is possible to improve the inter-plane temperature uniformity of the wafers 200, and to improve the processing quality of the wafers 200.

Figure 5:
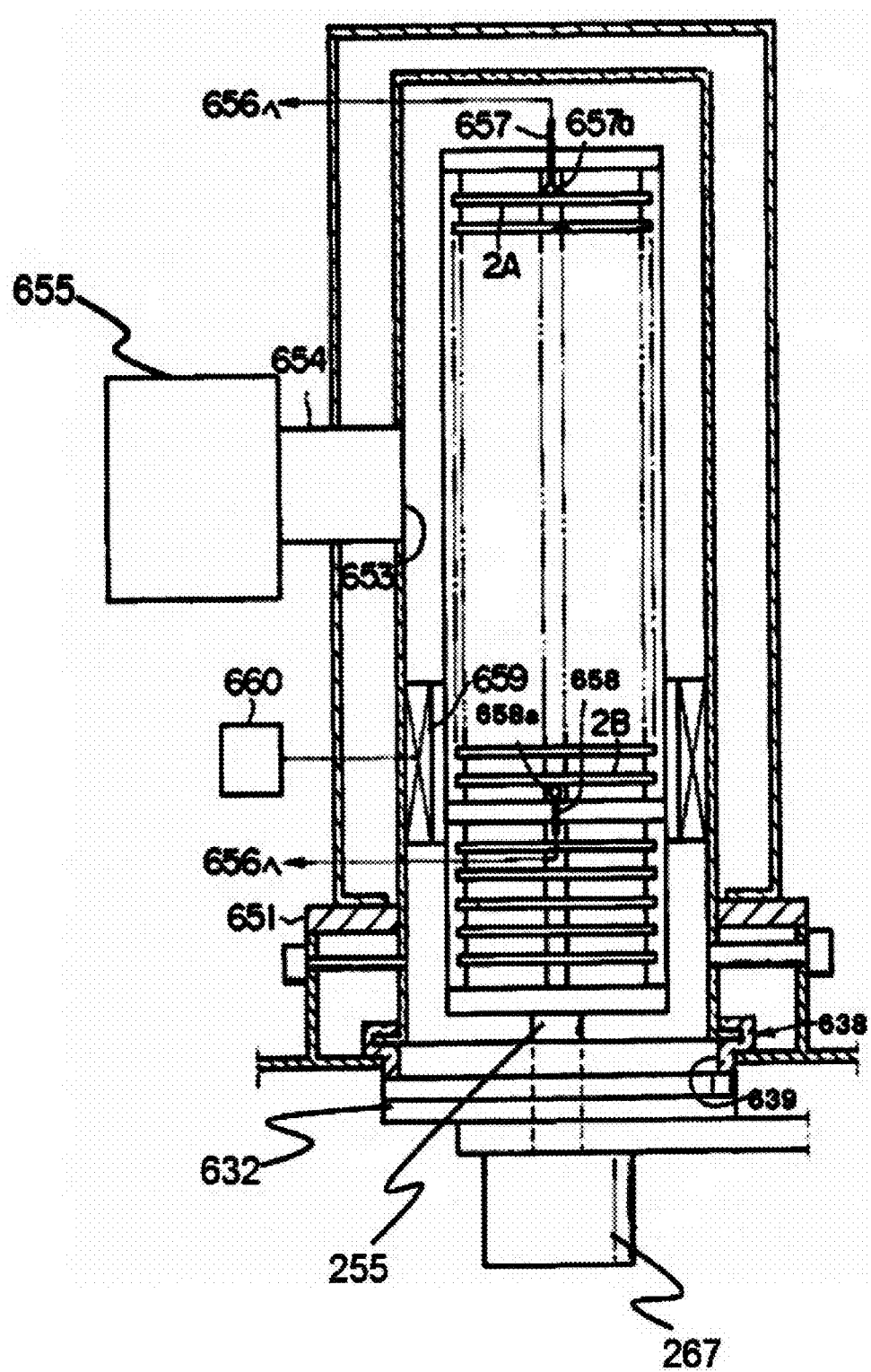
FIG. 5 is a schematic configuration diagram of the vertical type processing furnace of the substrate processing apparatus suitably used in the first embodiment of the present disclosure, in which a state that a substrate support is loaded into the portion of the processing furnace of FIG. 1 is shown.

As illustrated in FIG. 5, a rotary actuator 267 as a boat rotation mechanism is installed at the center of the lower surface of the seal cap 632. A rotary shaft 255 of the rotary actuator 267 supports the boat 217. That is, the rotary actuator 267 rotates the boat 217 and the wafers 200 supported by the boat 217 by rotating the rotary shaft 255. A base 651 is horizontally disposed outside the reaction tube 102, and a case 103 is arranged on the base 651 to be concentric with the reaction tube 102. The case 103 has a cylindrical shape or a polygonal tubular shape with its upper end closed, and is larger than the reaction tube 102. The case 103 surrounds the outside of the reaction tube 102 to prevent leakage of electromagnetic waves, protect the reaction tube 102, and protect the surrounding environment. The case 103 may also be omitted.

(Microwave Oscillator)

An electromagnetic wave introduction port 653 is installed on the sidewall of the reaction tube 102. One end of a waveguide 654 for supplying an electromagnetic wave into the process chamber 201 is connected to the electromagnetic wave introduction port 653. A microwave oscillator (electromagnetic wave source) 655 as a heating source for supplying an electromagnetic wave into the process chamber 201 to heat it is connected to the other end of the waveguide 654. The microwave oscillator 655 supplies an electromagnetic wave such as a microwave to the waveguide 654. A magnetron, klystron, or the like is used for the microwave oscillator 655.

Here, the frequency of the electromagnetic wave generated by the microwave oscillator 655 is controlled to fall within a frequency range of, desirably, 13.56 MHz to 24.125 GHz. More appropriately, it is desirable to be controlled to have a frequency of 2.45 GHz or 5.8 GHz.

A controller 121 as described hereinbelow is connected to the microwave oscillator 655. An upper thermocouple 657 as an upper temperature measurer (temperature sensor) for measuring a temperature of the upper portion in the process chamber 201 during the substrate processing and a lower thermocouple 658 as a lower temperature measurer (temperature sensor) for measuring a temperature of the lower portion in the process chamber 201 during the substrate processing, are connected to the controller 121. As illustrated in FIG. 5, a thermal contact 657a as a detector of the upper thermocouple 657 is arranged on an upper temperature monitoring wafer (referred to as the upper monitor wafer) 2A set at the uppermost stage of the boat 217, and a thermal contact 658a as a detector of the lower thermocouple 658 is arranged on a lower temperature monitoring wafer (referred to as the lower monitor wafer) 2B set at the lowermost stage of the boat 217. Therefore, the upper thermocouple 657 measures a temperature of the upper monitor wafer 2A and transmits it to the controller 121, and the lower thermocouple 658 measures a temperature of the lower monitor wafer 2B and transmits it to the controller 121. The upper monitor wafer 2A and the lower monitor wafer 2B are prepared so that the thermal characteristics, particularly the temperature characteristics, are the same as those of a wafer (hereinafter, also referred to as a product wafer) 200 to be heat-treated. As the upper monitor wafer 2A and the lower monitor wafer 2B, for example, the product wafer 200 that has become an unused item may be used. A plurality of product wafers 200 are arranged between the upper monitor wafer 2A and the lower monitor wafer 2B of the boat 217.

As a method of measuring the temperature of the substrate, the temperature of the substrate may be measured by not only using the thermocouple but also using a radiation thermometer, or may be measured using both the thermocouple and the radiation thermometer.

The product wafers 200 are processed from 1 to 250 sheets at a time. The number of wafers to be processed is desirably 3 to 150. By supporting and processing the plurality of product wafers in multiple stages along the vertical direction in this way, when the respective supported product wafers 200 are heated, they interfere with each other and thus can have a heat retention effect and improve the in-plane and inter-plane temperature uniformity of the wafers during heating.

A heater 659 as an auxiliary heater for heating the lower portion of the inside of the process chamber 201, i.e., the vicinity of the furnace opening part, is disposed in a concentric circle in the lower portion of the inner periphery of the reaction tube 102, and the heater 659 is disposed near the lower monitor wafer 2B when the boat 217 is loaded. The heater 659 includes a resistance heating member or the like, and is connected to a power source 660 controlled by the controller 121. The controller 121 feedback-controls the microwave oscillator 655 based on the measured temperature of the upper thermocouple 657 and feedback-controls the heater 659 based on the measured temperature of the lower thermocouple 658 to control the microwave oscillator 655 and the power source 660, respectively, so that the temperature of the upper thermocouple 657 and the temperature of the lower thermocouple 658 becomes the same. Here, a heating device mainly includes the microwave oscillator 655, the waveguide 654, and the electromagnetic wave introduction port 653. The heater 659 may also be regarded as included in the heating device.

As described above, the heater 659 is not limited to being disposed inside the process chamber 201, i.e., inside the reaction tube 102, but may be located outside the reaction tube so as to surround the reaction tube 102.

By heating the wafers with the microwave generated from the microwave oscillator 655 as the heating device in this way, since the wavelength of the microwave is longer than the thickness of the substrate, compared with a case where thermal modification using the conventional resistance heating or induction heating, or optical heating such as lamp heating is used, microwave absorption occurs in throughout the entire target deposited film. This makes it possible to uniformly modify even a pattern of high A/R.

In addition, since the energy for heating the wafers 200 is lower than that of a heating method such as a laser, the heating by the microwave suppress a phenomenon that the target deposited film may be melted and crystallized due to cooling of the melted target deposited film, such as the case of heating the wafers 200 with a high energy such as laser heating, namely the occurrence of the so-called liquid phased epitaxy (LPE) growth. Thus, it is possible to suppress the occurrence of deformation of the substrate due to recrystallization of the deposited film.

(Control Device)

Figure 2:
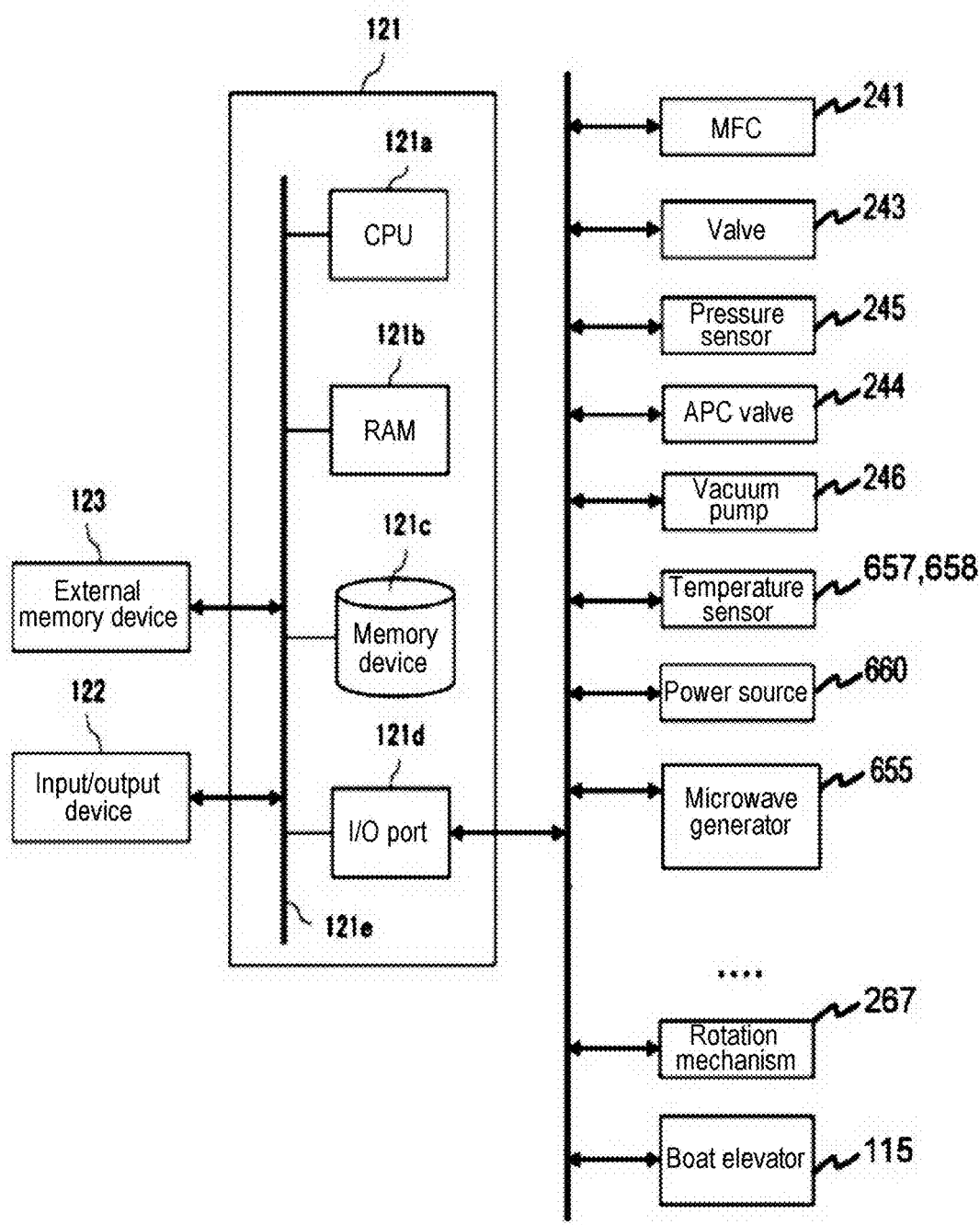
FIG. 2 is a schematic configuration diagram of a controller of the substrate processing apparatus suitably used in the present disclosure.

As illustrated in FIG. 2, the controller 121, which is a control part (control device), is connected to the MFC 241 as a gas flow rate control device, the valve 243 as the opening/closing valve, the pressure sensor 245, which detects the internal pressure of the process chamber 201, connected to the exhaust pipe 231, the APC valve 244, the vacuum pump 246, the power source 660 connected to the heater 659 as the heating device, the upper thermocouple 657 and the lower thermocouple 658 as the temperature sensors for detecting the internal temperature of the process chamber 201, the rotary actuator 267 as the rotation mechanism, the boat elevator 115, the microwave oscillator 655, and the like. The controller 121 controls the flow rate adjusting operation of an inert gas by the MFC 241, the opening/closing operation of the valve 243, the opening/closing operation of the APC valve 244, the pressure regulating operation performed by the APC valve 244 based on the pressure sensor 245, the temperature adjusting operation via the power supply control of the microwave oscillator 655 based on the upper thermocouple 657, the temperature adjusting operation of the heater 659 based on the lower thermocouple 658 and the power source 660, the driving and stopping of the vacuum pump 246, the rotational speed adjusting operation of the rotary actuator 267, the operation of moving the boat 217 up and down with the boat elevator 115, and the like.

Furthermore, the controller 121 may be configured as a computer including a central processing unit (CPU) 121a, a random access memory (RAM) 121b, a memory device 121c, and an I/O port 121d. The RAM 121b, the memory device 121c and the I/O port 121d are configured to exchange data with the CPU 121a via an internal bus 121e. An input/output device 122 formed of, e.g., a touch panel or the like, is connected to the controller 121.

The memory device 121c includes, for example, a flash memory, a hard disk drive (HDD), or the like. A control program for controlling operations of a substrate processing apparatus, a process recipe for specifying sequences and conditions of substrate processing such as thin film formation as described hereinbelow, or the like is readably stored in the memory device 121c. The process recipe functions as a program for causing the controller 121 to execute each sequence in a substrate processing process such as a film forming process, as described hereinbelow, to obtain a predetermined result. Hereinafter, the process recipe and the control program will be generally and simply referred to as a "program." Furthermore, when the term "program" is used herein, it may indicate a case of including only the process recipe, a case of including only the control program, or a case of including both the process recipe and the control program. The RAM 121b is configured as a memory area (work area) in which a program or data read by the CPU 121a is temporarily stored.

The I/O port 121d is connected to the MFC 241, the valve 243, the pressure sensor 245, the APC valve 244, the vacuum pump 246, the upper thermocouple 657 and the lower thermocouple 658 as the temperature sensors, the power source 660 connected to the heater 659, the microwave oscillator 655, the rotary actuator 267, the boat elevator 115, and the like, as described above.

The CPU 121a is configured to read the control program from the memory device 121c and execute the same. The CPU 121a is also configured to read the process recipe from the memory device 121c according to an input of an operation command from the input/output device 122 and the like. In addition, the CPU 121a is configured to control, according to the contents of the process recipe thus read, the flow rate adjusting operation of an inert gas by the MFC 241, the opening/closing operation of the valve 243, the opening/closing operation of the APC valve 244, the pressure regulating operation performed by the APC valve 244 based on the pressure sensor 245, the driving and stopping of the vacuum pump 246, the temperature adjusting operation via the power supply control of the microwave oscillator 655 based on the upper thermocouple 657, the temperature adjusting operation of the heater 659 based on the lower thermocouple 658 and the power source 660, the operation of rotating the boat 217 and adjusting the rotational speed of the boat 217 with the rotary actuator 267, the operation of moving the boat 217 up and down with the boat elevator 115, and the like.

The controller 121 may be configured by installing, on the computer, the aforementioned program stored in an external memory device 123 (for example, a magnetic tape, a magnetic disk such as a flexible disk or a hard disk, an optical disc such as a CD or DVD, a magneto-optical disc such as an MO, a semiconductor memory such as a USB memory or a memory card). The memory device 121c or the external memory device 123 is configured as a non-transitory computer-readable recording medium. Hereinafter, the memory device 121c and the external memory device 123 will be generally and simply referred to as a "recording medium." When the term "recording medium" is used herein, it may indicate a case of including only the memory device 121c, a case of including only the external memory device 123, or a case of including both the memory device 121c and the external memory device 123. Furthermore, the program may be supplied to the computer using communication means such as the Internet or a dedicated line, instead of using the external memory device 123.

(2) Substrate Processing Process

Next, an example of a method of modifying an amorphous silicon film as a silicon-containing film formed on a substrate using the processing furnace of the aforementioned substrate processing apparatus, which is one of the processes for manufacturing a semiconductor device, will be described below according to a process flow illustrated in FIGS. 3A and 3B. In the following descriptions, the operations of the respective parts constituting the substrate processing apparatus are controlled by the controller 121.

Figure 3A:
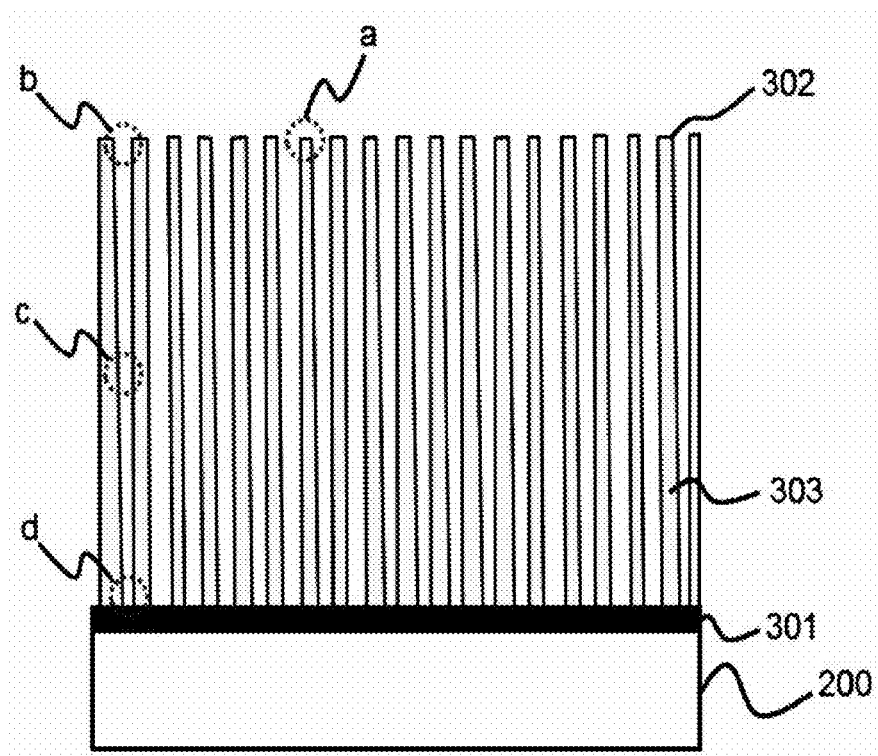
FIG. 3A is a schematic view illustrating a pattern of a substrate surface suitably used in the present disclosure.

A pattern with a high A/R as illustrated in FIG. 3A is formed on a wafer surface in the present embodiment, an SiO$_2$ film or an SiN film as an insulating film is formed as a base film on the pattern, and an amorphous silicon film (an amorphous silicon film or an a-Si film) or a polysilicon film (a polycrystalline silicon film or a poly-Si film), which is a deposited film to be processed, is formed on the insulating film. The deposited film to be processed is formed of a continuous thin film, and is formed to have a thickness of, for example, 30 Å (3 nm) to 200 Å (20 nm).

As illustrated in FIG. 3A, an insulating film 301 such as a silicon nitride film (SiN film) or a silicon oxide film (SiO$_2$ film) used as an etching stopper or the like is formed on a surface of a wafer 200, and an insulating film 301, and a pattern 303 formed by a silicon film (Si film), a silicon-containing film (Si-containing film) or the like having, for example, A/R of 20 to 100, is formed on the insulating film 301.

Figure 3B:
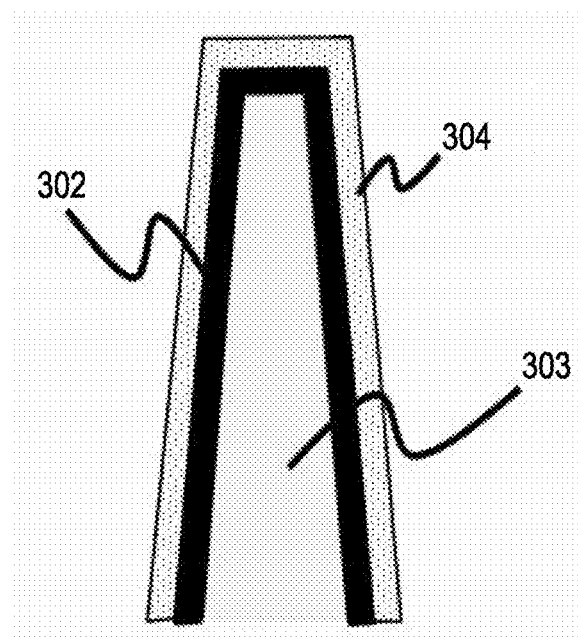
FIG. 3B is an enlarged view of a broken line region a in the substrate surface pattern of FIG. 3A.

Furthermore, as illustrated in FIG. 3B, a second insulating film 302 such as SiO$_2$ or SiN as a base film is formed on a surface of the pattern 303, and a film 304 to be processed such as amorphous silicon is formed on the insulating film 302.

When the term "wafer" is used herein, it may refer to "a wafer itself" or "a laminated body (aggregate) of a wafer and a predetermined layer or film formed on the surface of the wafer." That is, a wafer including a predetermined layer or film formed on its surface may be referred to as a wafer. In addition, when the phrase "a surface of a wafer" is used herein, it may refer to "a surface (exposed surface) of a wafer itself" or "a surface of a predetermined layer or film formed on a wafer, namely an uppermost surface of the wafer as a laminated body."

Accordingly, in the present disclosure, the expression "a predetermined gas is supplied to a wafer" may mean that "a predetermined gas is directly supplied to a surface (exposed surface) of a wafer itself" or that "a predetermined gas is supplied to a layer or film formed on a wafer, namely to an uppermost surface of a wafer as a laminated body." Furthermore, in the present disclosure, the expression "a predetermined layer (or film) is formed on a wafer" may mean that "a predetermined layer (or film) is directly formed on a surface (exposed surface) of a wafer itself" or that "a predetermined layer (or film) is formed on a layer, film or the like formed on a wafer, namely on an uppermost surface of a wafer as a laminated body."

In addition, when the term "substrate" is used herein, it may be synonymous with the term "wafer."

(Loading Step S402)

As illustrated in FIGS. 1 and 5, the upper monitor wafer 2A and the lower monitor wafer 2B having thermal characteristics equivalent to those of the product wafers 200 to be heat-treated are arranged in the uppermost and lowermost stages of the boat 217, respectively. When a predetermined number of wafers 200 are transferred to the boat 217, the boat elevator 115 moves the boat 217 up and loads it into the process chamber 201 (preparation, boat loading) (S402), as illustrated in FIG. 5.

The interval between the respective product wafers 200 may be set to be a half wavelength of a wavelength of an irradiated electromagnetic wave (a microwave or a millimeter wave) or longer. That is, if the frequency of electromagnetic wave is 10 GHz, it may be set to 1.5 cm or longer, if the frequency of electromagnetic wave may be set to 6 GHz, it is 2.5 cm or longer, and if the frequency of electromagnetic wave is 3 GHz, it may be set to 5 cm or longer.

(Pressure Regulating Step S404)

When the loading (preparation) of the boat 217 into the process chamber 201 is completed, the internal atmosphere of the process chamber 201 is exhausted such that the interior of the process chamber 201 has a predetermined pressure (e.g., 10 to 100 Pa). Specifically, the opening degree of the APC valve 244 is feedback-controlled based on the pressure information detected by the pressure sensor while being exhausted by the vacuum pump 246 so that the interior of the process chamber 201 has a desired pressure (S404).

(Inert Gas Supply Step S406)

The rotary actuator 267 rotates the boat 217. At this time, an inert gas such as a nitrogen gas is supplied from the gas supply pipe 232 (S406). The internal pressure of the process chamber 201 may be a predetermined value which falls within a range of 200 to 200,000 Pa, and is regulated to, for example, atmospheric pressure.

(Modification Step)

(Crystallization Step S408)

When the interior of the process chamber 201 has a desired pressure, the microwave oscillator 655 supplies a microwave into the process chamber 201, and raises the temperature of the wafers 200 accommodated in the process chamber 201 to a temperature range of 300 to 500 degrees C., which is a process temperature of the crystallization step. That is, the microwave oscillator 655 supplies a microwave or millimeter wave into the process chamber 201 via the waveguide 654. At this time, the temperature of the wafers 200 is desirably 400 to 500 degrees C., and the wafers 200 are desirably processed within a process time of 5 to 30 minutes after raising the temperature to the aforementioned temperature range.

Since the microwave supplied into the process chamber 201 enters and is efficiently absorbed into the wafers 200 accommodated in the process chamber 201, it is possible to very effectively raise the temperature of the wafers 200. Electric power obtained by multiplying the number of wafers for the case of one wafer may be supplied as a microwave power. By raising the temperature of the wafers 200 in this way, the amorphous silicon film on the wafer surface is modified (polycrystallized) into a polysilicon film.

Here, when crystallization is performed at a temperature equal to or higher than the aforementioned temperature range, i.e., at a temperature higher than 500 degrees C., the crystal grain diameter may be enlarged. If the crystal grain is enlarged, when the film to be processed is a thin film having a thickness of 30 to 200 Å, a number of grain boundaries may be generated. Thus, when the wafers 200 become semiconductor devices (semiconductor elements), a variation in characteristics may occur between the elements. In addition, when crystallization is performed at a temperature lower than the aforementioned temperature range, i.e., at a temperature lower than 300 degrees C., the amorphous silicon film cannot be sufficiently crystallized and thus there is a possibility that uniform modification processing may not be performed.

Furthermore, when the crystallization processing is performed within the aforementioned temperature range and a process time less than the aforementioned process time, namely less than 5 minutes, the amorphous silicon film cannot be sufficiently crystallized and thus there is a possibility that a uniform modifying process may not be performed. In addition, when the crystallization processing is performed within the aforementioned temperature range and the process time longer than the aforementioned process time, namely over a time longer than 30 minutes, the time that the wafers 200 are exposed to a high temperature becomes longer. Thus, thermal damage is likely to occur and there is a possibility that the crystal defect is likely to occur.

Therefore, by performing the crystallization step S408 within the aforementioned temperature range and process time, it is possible to perform polycrystallization of the amorphous film while keeping the crystal grain diameter small.

In addition, at this time, it may be configured such that an inert gas is supplied into the process chamber 201. For example, 10 slm of $N_2$ gas may be supplied as the inert gas. With this configuration, the substrate processing can be performed while exhausting impurities, which have been desorbed from the wafers 200 or the peripheral structure by heating.

Figure 6A:
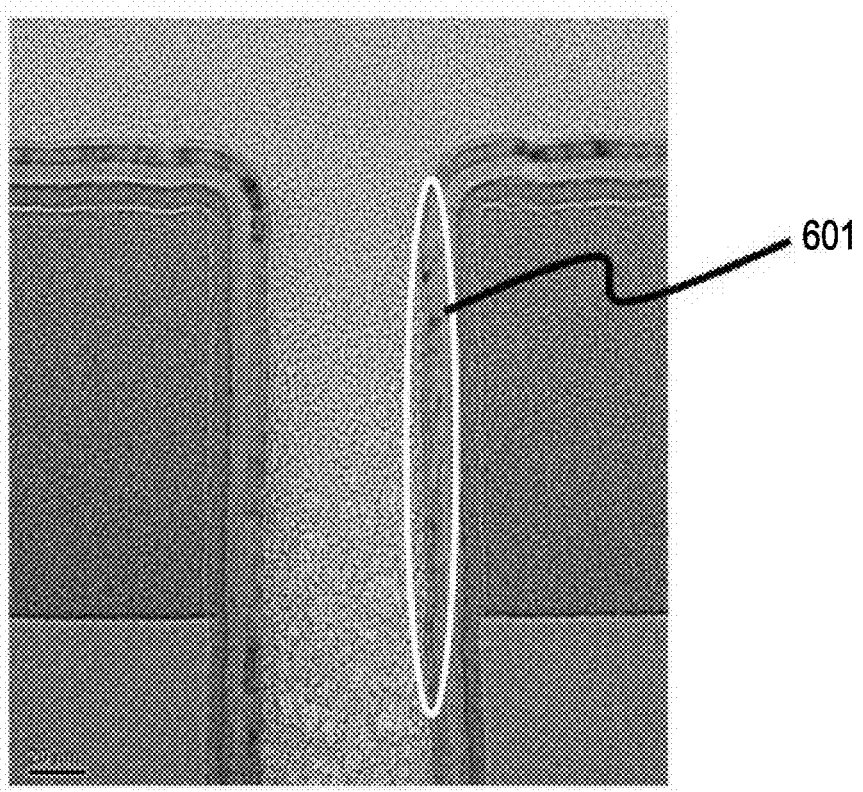
FIG. 6A is a transmission electron microscope (TEM) photograph of a broken line region b of FIG. 3A when a modification step in the present disclosure is performed.
Figure 6B:
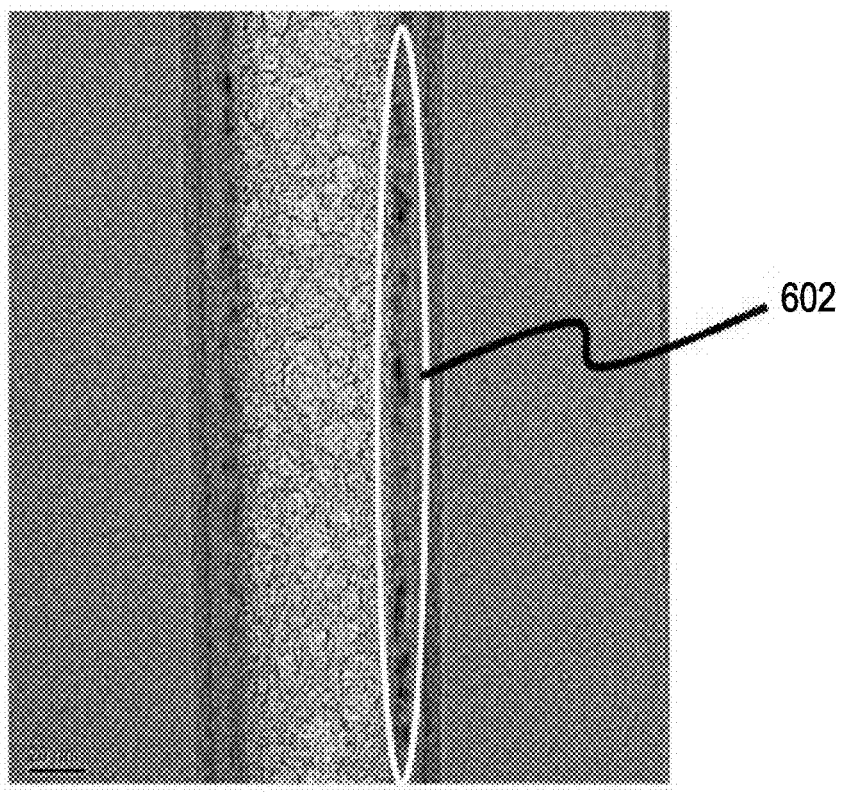
FIG. 6B is a TEM photograph of a broken line region c of FIG. 3A when the modification step in the present disclosure is performed.
Figure 6C:
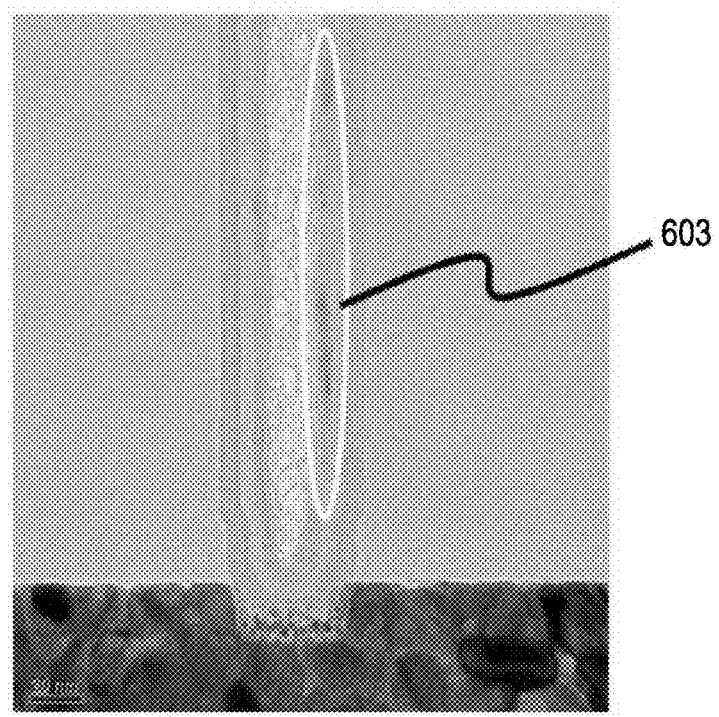
FIG. 6C is a TEM photograph of a broken line region d of FIG. 3A when the modification step in the present disclosure is performed.

As illustrated in FIGS. 6A to 6C, it can be seen that amorphous silicon regions 601, 602, and 603 formed on the base film with a high A/R are partially modified into polysilicon by heating the amorphous silicon film with the microwave.

By performing the crystallization step S408 for a predetermined period of time in this way, it is possible to uniformly crystallize the amorphous silicon into polysilicon with respect to the upper portion (TOP), the middle portion (MIDDLE), and the lower portion (BOTTOM) of the pattern 303.

While the crystallization step S408 is performed, the upper thermocouple 657 and the lower thermocouple 658 measure the temperatures of the upper monitor wafer 2A and the lower monitor wafer 2B, respectively, and transmit the measured temperatures to the controller 121. The controller 121 controls the microwave oscillator 655 by feedback-controlling the microwave oscillator 655 based on the measured temperature of the upper thermocouple 657.

It is desirable to raise the temperature of the wafers 200 not only by heating through the microwave oscillator 655 but also through the heater 659. More desirably, the power source 660 of the heater 659 is feedback-controlled based on the measured temperature of the lower thermocouple 658, and the power source 660 is controlled so that the temperature of the upper thermocouple 657 and the temperature of the lower thermocouple 658 become the same. With this configuration, it is possible not only to improve the inter-plane temperature uniformity of the wafers 200 supported in multiple stages along the vertical direction, but also to increase the rate of raising the temperature of the wafers 200, which can reduce thermal damage to the wafers 200.

(Treatment Step S410)

In the crystallization step S408, when the aforementioned predetermined process time has elapsed, the controller 121 controls the microwave oscillator 655 to raise the temperature of the wafers 200 to a temperature range equal to or higher than 500 degrees C. and equal to or lower than 700 degrees C., which is a process temperature of a treatment step. When the raised temperature of the wafers 200 reaches the process temperature of the treatment step, the process temperature is maintained for a predetermined time, and the treatment processing for repairing a crystal defect portion generated in the polysilicon crystallized at the crystallization step S408 is performed (S410). At this time, it is desirable that the process time of the treatment step be controlled so as to be equal to or more than 30 seconds and less than 5 minutes. More desirably, the processing may be performed so that, after the wafers 200 reach the aforementioned process temperature, the process time is within 1 minute.

Figure 7:
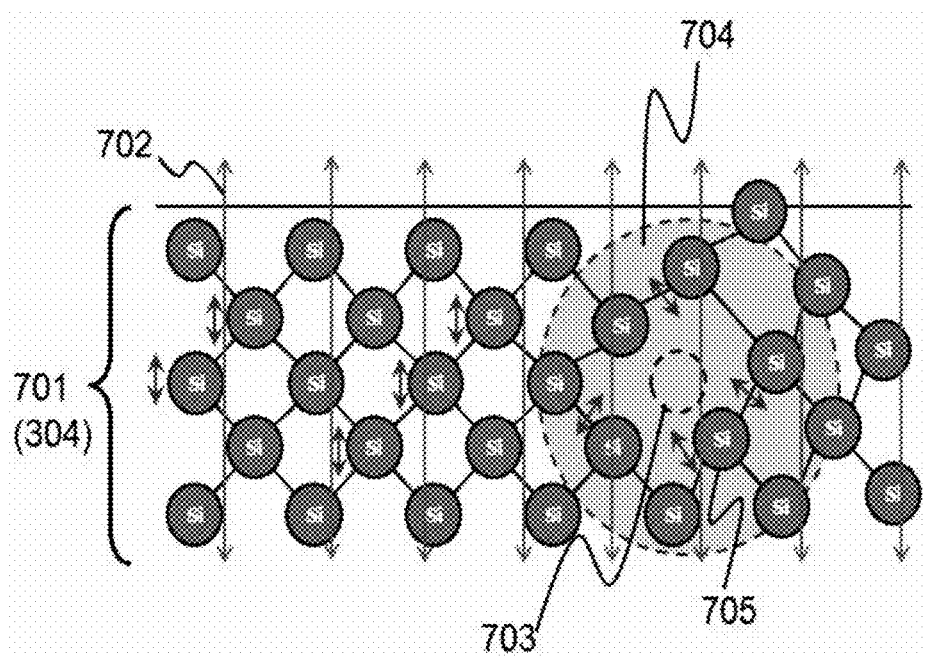
FIG. 7 is a schematic diagram illustrating a film to be processed when using a substrate processing process suitably used in the present disclosure.

More specifically, as illustrated in FIG. 7, by irradiating the polysilicon film 701 crystallized at the crystallization step S408 with a microwave 702, microwave excitation occurs to locally heat the periphery of a crystal defect 703 generated in a polysilicon film 701 (selective heating region 704) to repair the defect portion.

That is, by heating the wafers 200 to a temperature, which is the process temperature, equal to or higher than 500 degrees C. by the microwave of the aforementioned frequency, interface polarization occurs in the crystal of the polysilicon (particularly, silicon atoms 705 around the crystal defect 703) formed in the wafers 200. When the interface polarization occurs around the crystal defect 703, selective heating (local heating) occurs in the selective heating region 704 around the defect 703, and the crystal defect 703 is repaired by this selective heating. By such processing, it becomes possible to uniformly obtain a polysilicon film having low resistivity with less crystal defects.

When the treatment step is performed at, for example, a temperature higher than the aforementioned process temperature, i.e., at a process temperature higher than 700 degrees C., since the film on the surface of the wafers 200 reflects and does not absorb the microwave, not only is it that an efficient increase in temperature cannot be performed, but also the aforementioned crystal defects cannot be repaired. In addition, when the treatment step is performed at a temperature lower than the aforementioned process temperature, i.e., at a temperature of 500 degrees C. or lower, since the interface polarization does not occur in the wafers 200 and the selective heating hardly occurs around the crystal defect, it becomes difficult to repair the crystal defect.

Furthermore, when the processing of the treatment step is performed by remaining within the aforementioned temperature range and the process time equal to or more than the aforementioned process time, namely for 5 minutes or more, the time that the wafers 200 are exposed to a high temperature becomes longer. Thus, thermal damage is likely to occur and the crystal defect is likely to occur or there is a possibility that the wafers 200 will be deformed. In addition, when the processing is performed for a time shorter than 30 seconds, the wafers 200 are not sufficiently subjected to the treatment and thus there is a possibility that it may be difficult to repair the crystal defect.

Therefore, by performing the substrate processing within the temperature range and the process time as described above, it is possible to perform polycrystallization of the amorphous film while keeping the crystal grain diameter small, and further, to suppress deformation of the wafers 200 without excessively heating the deposited film or the wafers 200 to be processed.

Furthermore, it may be configured such that, during the treatment step S410, an inert gas is supplied into the process chamber 201. For example, 10 slm of $N_2$ gas may be supplied as the inert gas. With this configuration, it is possible to perform the substrate processing while exhausting impurities, which have been desorbed from the wafers 200 or the peripheral structure by heating.

While the treatment step S410 is performed, the upper thermocouple 657 and the lower thermocouple 658 measure the temperatures of the upper monitor wafer 2A and the lower monitor wafer 2B, respectively, and transmit the measured temperatures to the controller 121. The controller 121 controls the microwave oscillator 655 by feedback-controlling the microwave oscillator 655 based on the measured temperature of the upper thermocouple 657.

It is desirable to raise the temperature of the wafers 200 not only by heating through the microwave oscillator 655 but also through the heater 659. More desirably, the power source 660 of the heater 659 is feedback-controlled based on the measured temperature of the lower thermocouple 658, and the power source 660 is controlled so that the temperature of the upper thermocouple 657 and the temperature of the lower thermocouple 658 become the same. With this configuration, it is possible not only to improve the inter-plane temperature uniformity of the plurality of wafers 200 supported in multiple stages along the vertical direction, but also to increase the rate raising the temperature of the wafers 200, which can reduce thermal damage to the wafers 200.

By controlling the process as described above, it is possible to efficiently repair crystal defects even for a film formed in a pattern with a high A/R value, and also to suppress the expansion of crystal grain diameter of poly-crystals.

Furthermore, when an impurity as a dopant is implanted into the film to be processed, it is possible to suppress the diffusion of the dopant by the configuration as described above. By suppressing the dopant diffusion, it is possible to suppress the formation of leakage path due to segregation of the dopant in the grain boundary. This makes it possible to suppress an increase in leakage current.

(Unloading Step S412)

After the modification step is completed, the internal pressure of the process chamber 201 is returned to an atmospheric pressure (atmospheric pressure return). Thereafter, the boat elevator 115 moves the seal cap 632 down to open the furnace opening 639 and to unload the boat 217 from the furnace opening 639 to an area outside of the process chamber 201 (boat unloading) (S412).

By repeating the aforementioned operation, the plurality of wafers 200 are processed at a time.

(3) Effects according to the Present Embodiment

According to the present embodiment, one or more effects as set forth below may be achieved.

(a) By using the microwave heating method, even a film to be processed formed on a wafer pattern with a high aspect ratio can be uniformly modified.

(b) By performing the crystallization step of crystallizing the film to be processed within a temperature range of 300 to 500 degrees C. during the modification step, it is possible to perform crystallization while keeping the crystal grain diameter of the film to be processed small.

(c) By processing the treatment step of repairing the crystal defect of the film to be processed crystallized by the crystallization step within a temperature range equal to or higher than 500 degrees C. and equal to or lower than 700 degrees C. during the modification step, it is possible to efficiently raise the temperature of the wafers and to efficiently repair the crystal defect.

(d) By processing the treatment step within a temperature range equal to or higher than 500 degrees C. and equal to or lower than 700 degrees C. and shortening the process time to 5 minutes or less, it is possible to suppress the diffusion of the dopant implanted into the film to be processed, and to reduce the leakage current caused by the formation of the leakage path due to segregation of the dopant.

(e) By supporting a plurality of substrates to be processed in multiple stages along the vertical direction, it is possible to keep the temperature around the substrates to be processed, and to improve the inter-plane temperature uniformity of the substrates.

(f) By using not only the microwave heating but also the heater at the modification step, it is possible to improve the inter-plane temperature uniformity of the plurality of wafers supported in multiple stages along the vertical direction, and to reduce thermal damage to the wafers by efficiently raising the temperature of the wafers.

(4) Exemplary Modifications

The substrate processing apparatus according to the present embodiment is not limited to the aforementioned form but may be modified as in the modifications described below.

(Modification 1)

Figure 8:
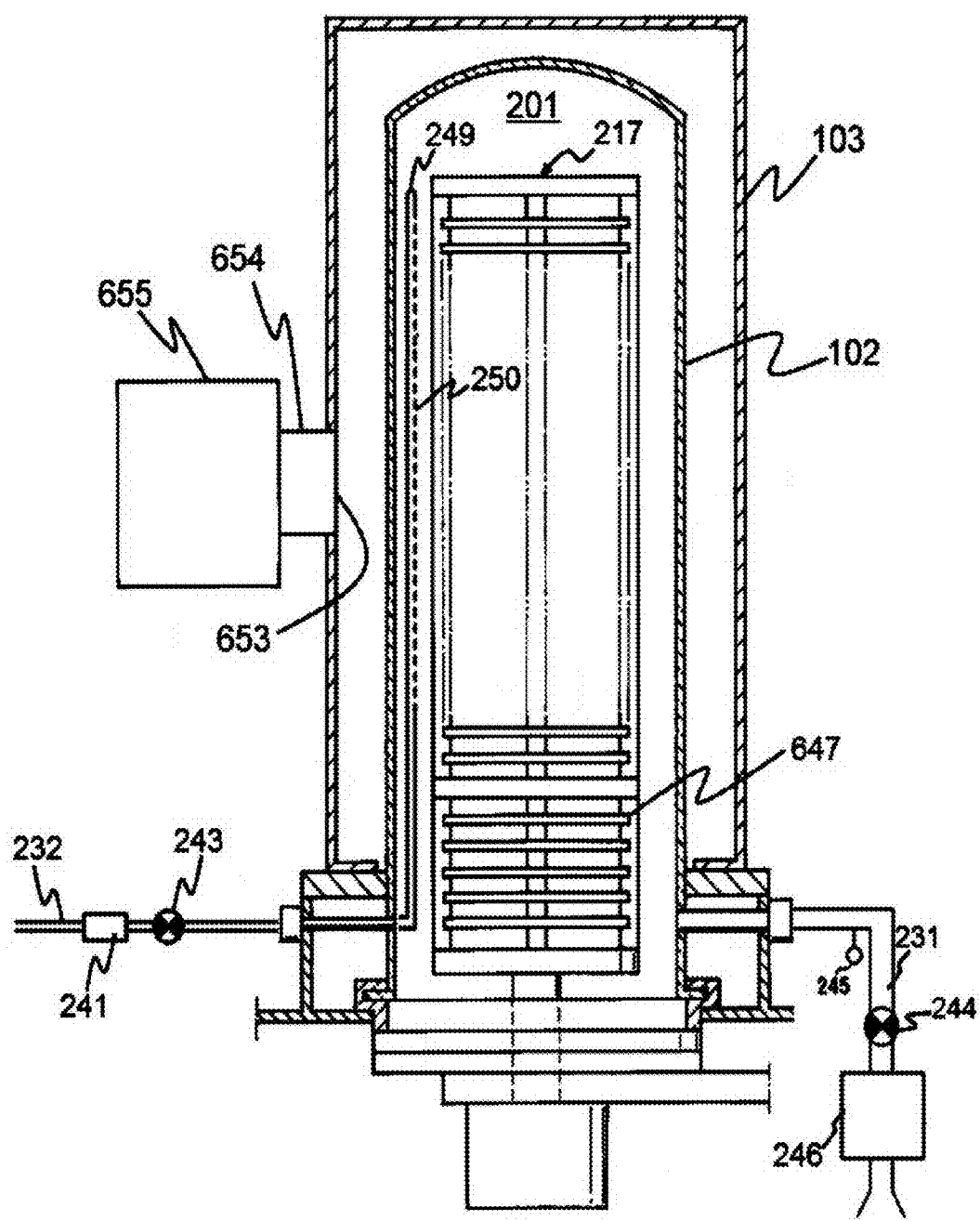
FIG. 8 is a diagram illustrating a first modification of the first embodiment of the present disclosure.

For example, as illustrated in FIG. 8, it may be configured such that, by making the reaction tube 102 forming the process chamber 201 of a material that transmits a microwave as an electromagnetic wave and arranging the electromagnetic wave introduction port 653 on the sidewall of the case 103, the volume of the process chamber 201 is reduced and the temperature of the inside of the process chamber 201 is easily raised and lowered. At this time, the case 103 is configured to have the same effect as that of the electromagnetic shield, which is the role of the reaction tube 102 in the first embodiment. That is, the case 103 in modification 1 is desirably made of a material that reflects a microwave, and more appropriately, the inner surface of the case 103 is desirably made of a material that reflects a microwave.

In addition, in modification 1, as illustrated in FIG. 8, an L-shaped long nozzle 249 (hereinafter, referred to as a "nozzle" 249) extending in an L shape along a vertical direction in the process chamber 201 are installed at the downstream end of the gas supply pipe 232. The nozzle 249 is not limited to the L-shaped long nozzle but may be a straight nozzle as a straight pipe.

Furthermore, at least one gas supply hole 250 for supplying a gas is installed at the downstream end of the nozzle 249 or on a sidewall surface of the nozzle 249. When the gas supply holes are formed on the sidewall surface of the nozzle 249, they are formed to face the center of the reaction tube 102, namely the center of the wafers 200, so as to allow a gas to be supplied toward the wafers 200. In addition, there are a plurality of gas supply holes 250 between the lower side of the reaction tube 102 and the upper side of the reaction tube 102, namely between the upstream side and the downstream side of the gas supply pipe 232, according to the stacking height of the wafers 200. The respective gas supply holes 250 may have the same aperture area and may be formed at the same aperture pitch.

With this configuration, for example, an inert gas can be supplied to the nozzle 249 and can in turn be supplied to the respective surfaces of the wafers 200 supported in multiple stages from the gas supply holes 250. Thus, it is possible to suppress impurities from adhering to the surfaces of the wafers, and to improve the characteristics of the processed film by the modification during annealing.

(Modification 2)

Figure 9:
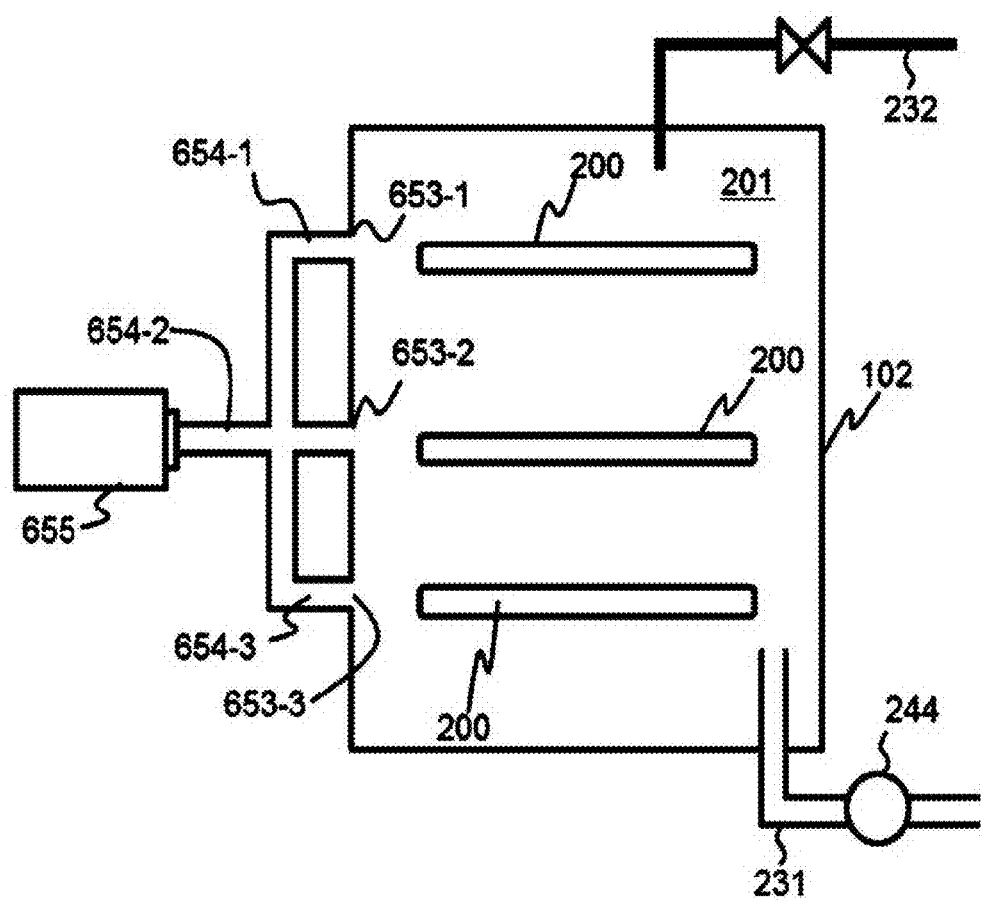
FIG. 9 is a diagram illustrating a second modification of the first embodiment of the present disclosure.

Furthermore, for example, as illustrated in FIG. 9, it may be configured such that, by branching the waveguide 654 connected to one microwave oscillator 655 into a plurality of waveguides until it is connected to the reaction tube 102, a plurality of electromagnetic wave introduction ports 653 are formed in the process chamber. That is, it may be configured such that the waveguide 654 is branched into waveguides 654-1, 654-2, and 654-3 with respect to the microwave oscillator 655, and electromagnetic wave introduction ports 653-1, 653-2, and 653-3 are installed at the end portions of the respective waveguides. With this configuration, it is possible to install the plurality of electromagnetic wave introduction ports 653, and to more uniformly process the plurality of wafers 200 supported in multiple stages along the vertical direction.

In addition, at this time, the gas supply pipe 232 for the process gas may be installed above the reaction tube 102, and the gas supply part may be installed so as to generate a gas flow from the upper side to the lower side of the reaction tube 102.

With this configuration, it is possible to efficiently exhaust a gas to the exhaust pipe 231 installed below the reaction tube 102, and to suppress impurities such as particles from adhering to the surfaces of the wafers 200.

(Modification 3)

Figure 10:
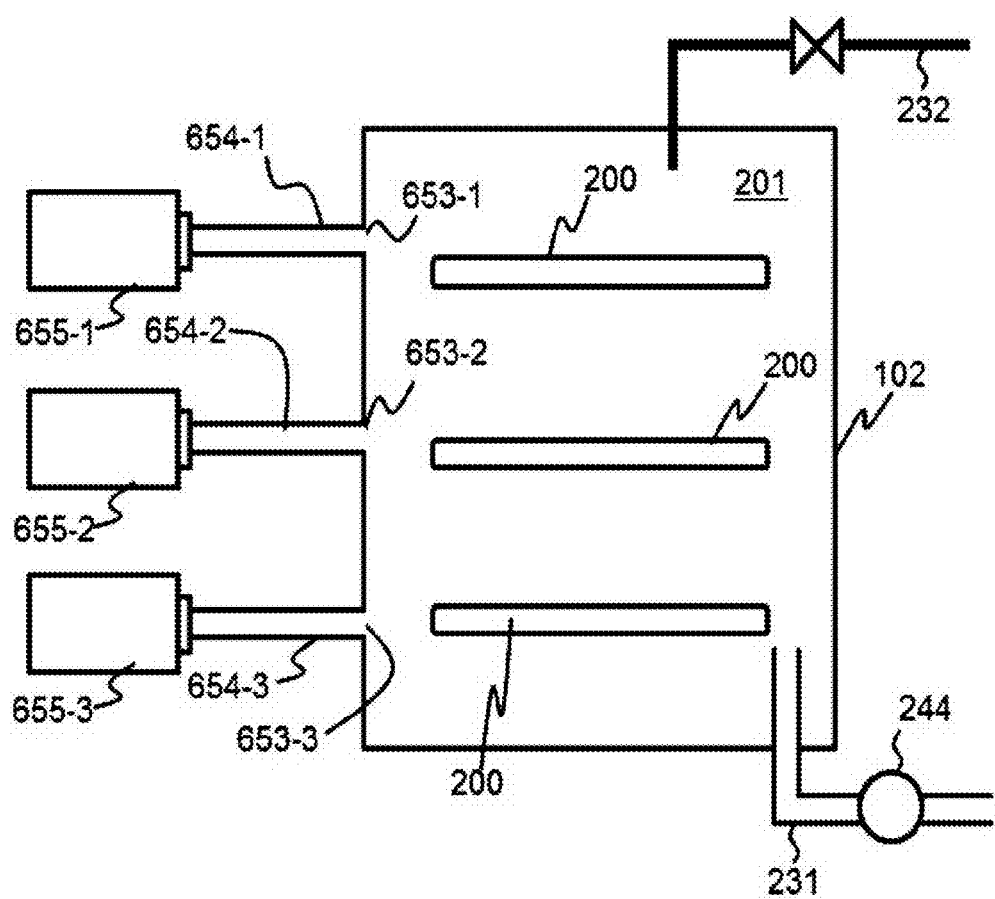
FIG. 10 is a diagram illustrating a third modification of the first embodiment of the present disclosure.

Furthermore, for example, as illustrated in FIG. 10, microwave oscillators 655-1, 655-2 and 655-3 may be disposed in pairs with respect to the wafers 200, and waveguides which are transmission paths of the microwave are desirably installed to correspond to the individual microwave oscillators 655, respectively. With this configuration, it is possible to stably supply the microwave into the process chamber, and thus to more uniformly process the plurality of wafers 200 supported in multiple stages along the vertical direction.

Second Embodiment of the Present Disclosure

Next, a second embodiment of the present disclosure will be described with reference to FIG. 11.

(5) Configuration of the Substrate Processing Apparatus

In the second embodiment, a substrate processing apparatus according to the present disclosure is configured as a single-wafer-type heat treatment apparatus that performs various heat treatments on a wafer. In the present embodiment, the components having the same functions as those of the first embodiment are given the same reference numerals and a description thereof will be omitted.

(Process Chamber)

Figure 11:
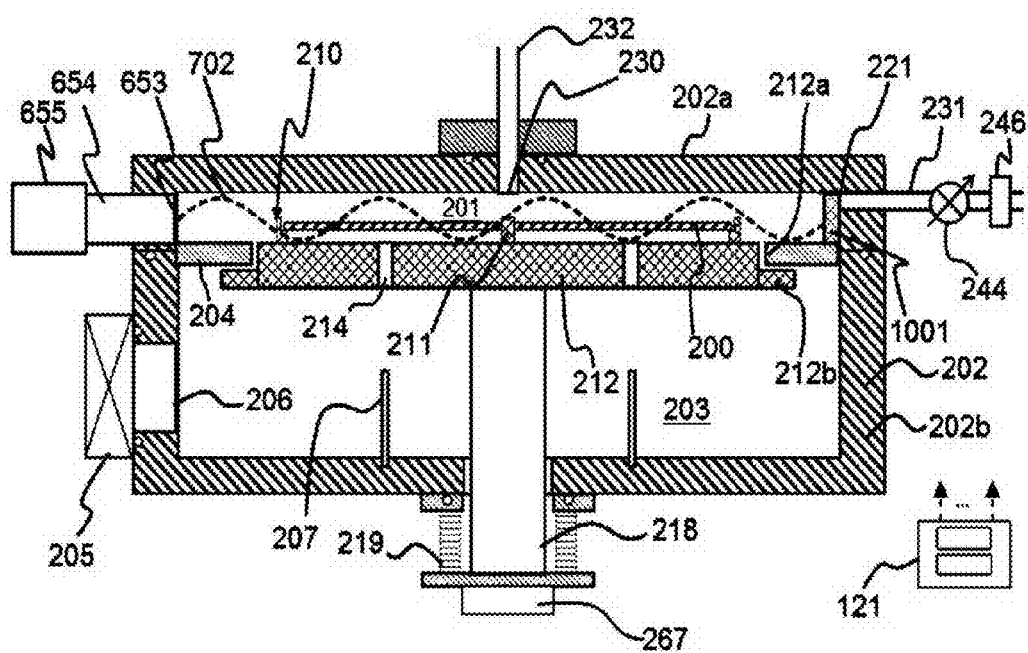
FIG. 11 is a schematic configuration diagram of a single-wafer-type processing furnace of a substrate processing apparatus suitably used in a second embodiment of the present disclosure, in which a portion of the processing furnace is shown in a vertical cross sectional view.

As illustrated in FIG. 11, the substrate processing apparatus according to this embodiment includes an upper vessel 202a and a lower vessel 202b corresponding to the reaction tube 102 in the first embodiment, and a process vessel 202 configured by a partition plate 204 installed between the upper vessel 202a and the lower vessel 202b. The process vessel 202 is configured as, for example, a flat sealed vessel having a circular cross section. Furthermore, the process vessel 202 is made of a metal material such as, e.g., aluminum (Al) or stainless steel (SUS), or quartz or the like. A process chamber 201 configured to process a wafer 200 such as silicon wafer as a substrate, and a transfer space 203 are formed in the process vessel 202. In addition, a space which is surrounded by the upper vessel 202a and which is above the partition plate 204 may be referred to as the process chamber 201 or a reaction area 201, and a space which is surrounded by the lower vessel 202b and which is below the partition plate 204 may be referred to as a transfer area 203.

A substrate loading/unloading port 206 adjacent to a gate valve 205 is installed on a side surface of the lower vessel 202b, and the wafer 200 is transferred from and to a transfer chamber (not shown) via the substrate loading/unloading port 206. A plurality of lift pins 207 are installed in a bottom portion of the lower vessel 202b. Furthermore, the lower vessel 202b is at a ground potential.

An electromagnetic wave introduction port 653 is installed on a side surface of the upper vessel 202a. One end of a waveguide 654 for supplying a microwave into the process chamber 201 is connected to the electromagnetic wave introduction port 653. A microwave oscillator (electromagnetic wave source) 655 as a heating source for supplying an electromagnetic wave into the process chamber 201 to heat it is connected to the other end of the waveguide 654. It is desirable that the diameter of the electromagnetic wave introduction port 653 be configured to be equal to the height from the partition plate 204 to the ceiling wall of the upper vessel 202a, namely the height of the process chamber 201. With this configuration, it is possible to more efficiently supply the microwave to the surface of the wafer. Furthermore, the volume of the process chamber 201 can be reduced, thereby shortening the exhaust time in the process chamber 201.

In addition, a conductive mesh formed in a net shape as a conductive member for suppressing the entry of microwaves into an exhaust part (exhaust pipe 231) as described hereinbelow is installed on the side surface of the upper vessel 202a and on the side of the process chamber 201 of an exhaust port 221 as described hereinbelow. By suppressing the entry of microwaves into the exhaust part by the conductive mesh, it is possible to suppress unnecessary heating of the peripheral member installed in the process chamber.

A substrate support part 210 as a substrate support for supporting the wafer 200 is installed in the process vessel 202. The substrate support part 210 mainly includes a substrate mounting part 211 for placing the wafer 200 thereon and corresponds to the support post 645 of the first embodiment, and a substrate mounting table 212 having the substrate support part 210 on its surface. Through holes 214 through which the lift pins 207 penetrate are formed on the substrate mounting table 212 at positions corresponding to the lift pins 207, respectively. Here, the substrate support part 210 illustrated in FIG. 11 is configured to support one substrate, but the substrate support part 210 is not limited thereto and may be configured to support a plurality of substrates.

A side wall 212a of the substrate mounting table 212 has a protrusion 212b protruding in the radial direction of the substrate mounting table 212. The protrusion 212b is installed on a bottom surface side of the substrate mounting table 212. The protrusion 212b is close to or makes contact with the partition plate 204 so that the internal atmosphere of the process chamber 201 is prevented from moving into the transfer space 203 and the internal atmosphere of the transfer space 203 is prevented from moving into the process chamber 201.

The substrate mounting table 212 is supported by a shaft 218. The shaft 218 penetrates a bottom portion of the process vessel 202, and further, is connected to the rotary actuator 267 outside the process vessel 202. By operating the rotary actuator 267 to move the shaft 218 and the substrate mounting table 212 up and down, it is possible to raise and lower the wafer 200 placed on the substrate mounting part 211. The periphery of a lower end portion of the shaft 218 is covered with a bellows 219 to hermetically seal the interior of the process chamber 201.

When the wafer 200 is transferred, the substrate mounting table 212 is lowered to a substrate support table so that the substrate mounting part 211 is at the position of the substrate loading/unloading port 206 (wafer transfer position), and when the wafer 200 is processed, the wafer 200 is raised to a processing position (wafer processing position) in the process chamber 201 as illustrated in FIG. 11.

Specifically, when the substrate mounting table 212 is lowered to the wafer transfer position, it is configured such that the upper end portion of the lift pins 207 protrudes from the upper surface of the substrate mounting part 211 and the lift pins 207 support the wafer 200 from below. Furthermore, when the substrate mounting table 212 is raised to the wafer processing position, it is configured such that the lift pins 207 are buried from the upper surface of the substrate mounting part 211 and the substrate mounting part 211 supports the wafer 200 from below. Since the lift pins 207 directly make contact with the wafer 200, it is desirable that the lift pins 207 be made of a material such as, e.g., quartz or alumina.

(Exhaust Part)

An exhaust part for exhausting the atmosphere of the process chamber 201 is installed on the outer periphery of the process chamber 201 (upper vessel 202a). As illustrated in FIG. 11, the exhaust port 221 is installed in the exhaust part. The exhaust pipe 231 is connected to the exhaust port 221, and an APC valve 244 as a pressure regulator for controlling the interior of the process chamber 201 to a predetermined pressure, and a vacuum pump 246 is sequentially connected in series to the exhaust pipe 231. The exhaust part (exhaust line) mainly includes the exhaust port 221, the exhaust pipe 231, and the APC valve 244. Furthermore, an exhaust path may be arranged so as to surround the process chamber 201, and it may be configured so as to allow a gas to be exhausted from the entire circumference of the wafer 200. In addition, a vacuum pump 246 may be added to the configuration of the exhaust part.

(Gas Introduction Port)

A gas introduction port 230 for supplying various kinds of gases into the process chamber 201 is installed on the upper surface (ceiling wall) of the upper vessel 202a installed in the upper portion of the process chamber 201.

(Inert Gas Supply Part)

A gas supply pipe 232 for supplying an inert gas is connected to the gas introduction port 230 connected to the upper surface of the upper vessel 202a.

(6) Substrate Processing Process

A substrate processing process which is one of the manufacturing processes of a semiconductor device using the aforementioned substrate processing apparatus of the second embodiment is similar to the substrate processing process of the first embodiment.

That is, the substrate processing is performed in the order of the loading step S402, the pressure regulating step S404, the inert gas supply step S406, the crystallization step S408, the treatment step S410, the atmospheric pressure return step S412, and the unloading step S414.

(7) Effects according to the Present Embodiment

According to the present embodiment, one or more effects as set forth below may be achieved in addition to the effects of the first embodiment.

(g) Since the volume of the process chamber can be reduced, it is possible to further shorten the time for raising and lowering the temperature in the process chamber 201 or of the wafer 200, and to improve the throughput of substrate processing.

(h) Since the number of wafers 200 to be processed is small, the temperature control becomes easy and the temperature of the wafers 200 can be accurately controlled.

Although the present disclosure has been described above with reference to the embodiments, the aforementioned respective embodiments, the respective modifications and the like may be properly combined and the effects thereof may also be achieved.

For example, in the aforementioned substrate processing process, a preliminary heating step may be further added in which the heater 659 is operated in advance when performing the substrate loading step S402, thereby preliminarily heating the wafers 200 to a predetermined temperature. With this configuration, it becomes easy to raise the temperature of the wafers 200 carried into the process chamber 201 to the first temperature, and as a result, it is possible to shorten the process time of the wafers 200.

Furthermore, for example, in each of the aforementioned embodiments, there has been described the process in which the amorphous silicon film is modified into the polysilicon film as the film containing silicon as a main component. However, the present disclosure is not limited thereto and the film formed on the surface of the wafers 200 may be modified by supplying a gas containing at least one or more of oxygen (O), nitrogen (N), carbon (C), and hydrogen (H). For example, in the case where a hafnium oxide film ($Hf_xO_y$ film) as a high dielectric film is formed on the wafers 200, a microwave is supplied while supplying a gas containing oxygen to heat it, whereby defective oxygen in the hafnium oxide film can be supplemented to improve the characteristics of the high dielectric film, or a microwave is supplied while supplying a nitrogen gas ($N_2$ gas) to heat it, whereby an uncrystallized portion in the hafnium oxide film can be crystallized to improve the characteristics of the high dielectric film.

Furthermore, although the hafnium oxide film is illustrated herein, the present disclosure is not limited thereto but may be suitably applied to a case of forming an oxide film, i.e., a metal-based oxide film, containing a metal element containing at least one of aluminum (Al), titanium (Ti), zirconium (Zr), tantalum (Ta), niobium (Nb), lanthanum (La), cerium (Ce), yttrium (Y), barium (Ba), strontium (Sr), calcium (Ca), lead (Pb), molybdenum (Mo), tungsten (W) and the like. That is, the aforementioned film forming sequence may be suitably applied to a case of forming a TiOCN film, a TiOC film, a TiON film, a TiO film, a ZrOCN film, a ZrOC film, a ZrON film, a ZrO film, an HfOCN film, an HfOC film, an HfON film, an HfO film, a TaOCN film, a TaOC film, a TaON film, a TaO film, an NbOCN film, an NbOC film, an NbON film, an NbO film, an AlOCN film, an AlOC film, an AlON film, an AlO film, an MoOCN film, an MoOC film, an MoON film, an MoO film, a WOCN film, a WOC film, a WON film, and a WO film, on the wafers 200.

In addition, the present disclosure is not limited to the high dielectric film, but a film containing silicon doped with an impurity as a main component may be heated. As the film containing silicon as a main component, there are an Si-based oxide film such as a silicon nitride film (SiN film), a silicon oxide film (SiO film), a silicon oxycarbide film (SiOC film), a silicon oxycarbonitride film (SiOCN film), a silicon oxynitride film (SiON film) or the like, an epitaxial silicon film (Epi-Si film), an epitaxial silicon germanium film (Epi-SiGe film), and the like. Examples of the impurity include at least one or more of bromine (B), carbon (C), nitrogen (N), aluminum (Al), phosphorus (P), gallium (Ga), arsenic (As) and the like. In addition to the aforementioned film containing silicon as a main component and metal oxide film, an epitaxial germanium film (Epi-Ge film) or a film formed using Group 3-5 element may be heated.

Furthermore, the film may be a resist film based on at least one of methyl methacrylate resin (polymethyl metacrylate: PMMA), epoxy resin, novolak resin, polyvinyl phenyl resin, and the like.

Although one of the manufacturing processes of the semiconductor device has been described above, the present disclosure is not limited thereto but may also be applied to a technique for processing a substrate such as a patterning process of the manufacturing processes of a liquid crystal panel, a patterning process of the manufacturing processes of a solar cell, a patterning process of the manufacturing processes of a power device, or the like.

According to the present disclosure in some embodiments, it is possible to provide a technique capable of performing uniform substrate processing.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of manufacturing a semiconductor device, comprising:
    preparing a substrate, in which an insulating film as a base film is formed on a pattern having an aspect ratio of 20 or greater and a process target film having a thickness of 200 Å or smaller is formed on the insulating film, in a process chamber;
    raising a temperature of the substrate to a first temperature with an electromagnetic wave supplied from a heating device, wherein the first temperature ranges from 300 to 500 degrees C.;
    crystallizing the process target film of the substrate for a first process time period while maintaining the first temperature, wherein the first process time period ranges from 5 to 30 minutes;
    raising the temperature of the substrate from the first temperature to a second temperature, which is higher than the first temperature, with the electromagnetic wave supplied from the heating device, after the crystallizing the process target film; and
    repairing a crystal defect of the crystallizing the process target film of the substrate for a second process time period, which is shorter than the first process time period, while maintaining the second temperature.

2. The method of claim 1, wherein a plurality of substrates supported in multiple stages along a vertical direction are prepared in the process chamber, and temperatures of the plurality of substrates are raised using one or both of an electromagnetic wave oscillator installed on a side surface of the process chamber to oscillate the electromagnetic wave and a heater installed to be concentric with the process chamber to generate heat by resistance heating.

3. The method of claim 1, wherein the process target film is an amorphous film.

4. The method of claim 3, wherein in the crystallizing the process target film, the amorphous film is crystallized.

5. The method of claim 3, wherein the second temperature is higher than 500 degrees C. and equal to or lower than 700 degrees C.

6. The method of claim 3, wherein the second process time period is shorter than 5 minutes.

7. The method of claim 1, wherein the second temperature is a temperature at which polarization occurs in the process target film.

8. The method of claim 1, wherein a wavelength of the electromagnetic wave is longer than a thickness of the substrate.

9. The method of claim 1, wherein in the crystallizing the process target film or the repairing the crystal defect, the substrate is processed while an inert gas is supplied.

10. The method of claim 1, wherein a plurality of substrates supported in multiple stages along a vertical direction are prepared in the process chamber, and an interval between the plurality of substrates is equal to or longer than a half wavelength of a wavelength of the electromagnetic wave supplied from the heating device installed on a side surface of the process chamber.

11. The method of claim 1, wherein a plurality of substrates supported in multiple stages along a vertical direction are prepared in the process chamber, and the heating device is controlled to raise temperatures of the plurality of substrates so that a temperature of an upper temperature measurer configured to measure a temperature of an upper portion of the process chamber and a temperature of a lower temperature measurer configured to measure a temperature of a lower portion of the process chamber become equivalent.

12. A substrate processing apparatus, comprising:
    a process chamber configured to process a substrate, in which an insulating film as a base film is formed on a pattern having an aspect ratio of 20 or greater and a process target film having a thickness of 200 Å or smaller is formed on the insulating film;
    a heating device configured to supply an electromagnetic wave into the process chamber to heat the substrate; and
    a control part configured to control the heating device to perform:
    raising a temperature of the substrate to a first temperature with the electromagnetic wave, wherein the first temperature ranges from 300 to 500 degrees C.;
    crystallizing the process target film of the substrate for a first process time period at the first temperature, wherein the first process time period ranges from 5 to 30 minutes;
    raising the temperature of the substrate from the first temperature to a second temperature, which is higher than the first temperature, with the electromagnetic wave, after the crystallizing the process target film; and
    repairing a crystal defect of the crystallizing the process target film of the substrate for a second process time period, which is shorter than the first process time period, at the second temperature.

13. The apparatus of claim 12, further comprising:
    an upper temperature measurer configured to measure a temperature of an upper portion of the process chamber; and
    a lower temperature measurer configured to measure a temperature of a lower portion of the process chamber,
    wherein the heating device is installed on a side surface of the process chamber, and a plurality of substrates supported in multiple stages along a vertical direction are prepared in the process chamber, and
    wherein the control part is configured to control the heating device such that the temperature of the upper temperature measurer and the temperature of the lower temperature measurer become equivalent.

14. A non-transitory computer-readable recording medium storing a program that causes a substrate processing apparatus to perform a process by a computer, the process comprising:
    preparing a substrate, in which an insulating film as a base film is formed on a pattern having an aspect ratio of 20 or greater and a process target film having a thickness of 200 Å or smaller is formed on the insulating film, in a process chamber;

raising a temperature of the substrate to a first temperature with an electromagnetic wave supplied from a heating device, wherein the first temperature ranges from 300 to 500 degrees C.;

crystallizing the process target film of the substrate for a first process time period after the raising the temperature of the substrate to the first temperature, wherein the first process time period ranges from 5 to 30 minutes;

raising the temperature of the substrate from the first temperature to a second temperature, which is higher than the first temperature, with the electromagnetic wave supplied from the heating device, after the crystallizing the process target film; and repairing a crystal defect of the crystallizing the process target film of the substrate for a second process time period, which is shorter than the first process time period, after the raising the temperature of the substrate to the second temperature.

15. The recording medium of claim 14, wherein the second temperature is higher than 500 degrees C. and equal to or lower than 700 degrees C.

16. The recording medium of claim 14, wherein a plurality of substrates supported in multiple stages along a vertical direction are prepared in the process chamber, and the heating device is controlled to raise temperatures of the plurality of substrates so that a temperature of an upper temperature measurer configured to measure a temperature of an upper portion of the process chamber and a temperature of a lower temperature measurer configured to measure a temperature of a lower portion of the process chamber become equivalent.

* * * * *